(12) United States Patent
Hall et al.

(10) Patent No.: US 9,923,320 B1
(45) Date of Patent: Mar. 20, 2018

(54) ELECTRICAL INTERCONNECTION SYSTEM FOR CONNECTING MULTIPLE ELECTRICAL MODULES TO AN ELECTRICAL DEVICE

(71) Applicants: David R. Hall, Provo, UT (US); Seth Myer, Eagle Mtn., UT (US)

(72) Inventors: David R. Hall, Provo, UT (US); Seth Myer, Eagle Mtn., UT (US)

( * ) Notice: Subject to any disclaimer, the term of this patent is extended or adjusted under 35 U.S.C. 154(b) by 0 days.

(21) Appl. No.: 15/383,341

(22) Filed: Dec. 19, 2016

(51) Int. Cl.
*H01R 25/00* (2006.01)
*H01R 25/14* (2006.01)
*H02S 20/23* (2014.01)
*H02S 40/36* (2014.01)

(52) U.S. Cl.
CPC ........... *H01R 25/145* (2013.01); *H02S 20/23* (2014.12); *H02S 40/36* (2014.12)

(58) Field of Classification Search
CPC ...... H01R 25/00; H01R 25/003; H01R 25/14; H01R 24/142; H01R 9/2608; H01R 9/2691
USPC .......... 439/928, 214–216, 110, 111; 136/244
See application file for complete search history.

(56) References Cited

U.S. PATENT DOCUMENTS

| | | | | |
|---|---|---|---|---|
| 2,175,145 A * | 10/1939 | Davison | ............... | H01R 25/162 439/216 |
| 3,132,204 A * | 5/1964 | Gerrerup | .................. | H01B 7/10 156/47 |
| 3,524,921 A * | 8/1970 | Wolf | ..................... | H01B 7/0838 174/117 FF |
| 4,203,646 A * | 5/1980 | Desso | .................. | H01R 4/4809 136/244 |
| 6,184,496 B1 * | 2/2001 | Pearce | .................. | E01C 11/265 219/202 |
| 7,678,991 B2 * | 3/2010 | McCaskill | ................ | E04D 1/26 136/244 |

* cited by examiner

*Primary Examiner* — Phuong Dinh

(57) ABSTRACT

An electrical interconnection system is disclosed. An electrically conductive material is embedded into a membrane providing both an electrical pathway to connect multiple electrical modules and a connection system to connect the modules to the membrane. Electrical modules are connected to the membrane by removing a protective backing material from an adhesive area covering electrical contacts on a bottom side of an electrical module, and adhering to an adhesive area on the membrane, connecting the contacts to the electrically conductive material in the membrane. No external wiring, connectors or devices are required to make the electrical connection between the modules and the membrane. Contacts are integral and embedded into the surface of each individual module. The modules have adhesive on the back to allow them to be adhesively attached to the membrane without any additional mounting hardware.

20 Claims, 11 Drawing Sheets

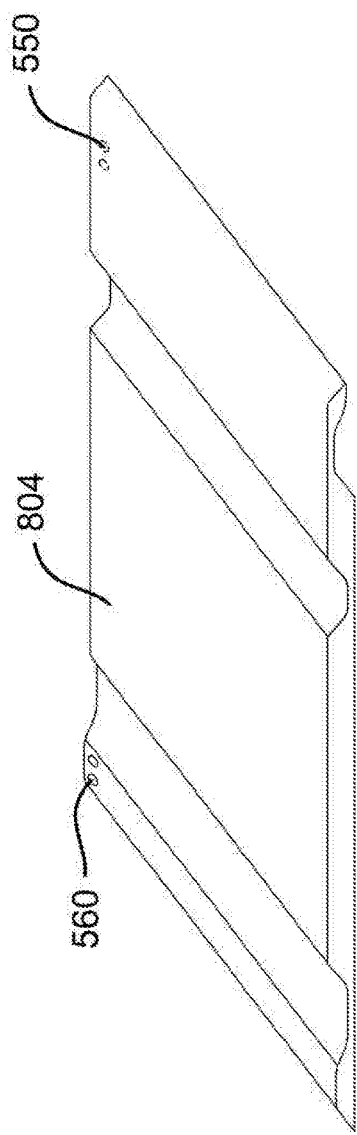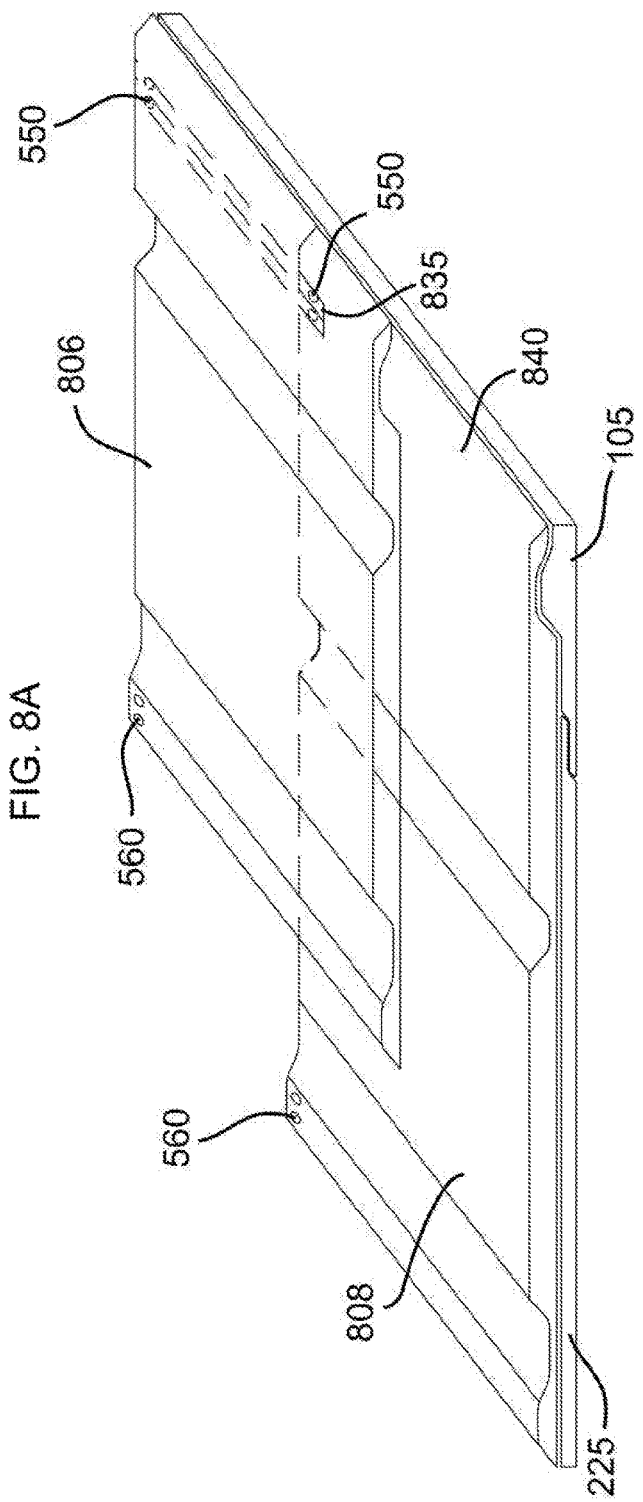

ELECTRICAL INTERCONNECTION SYSTEM FOR CONNECTING MULTIPLE ELECTRICAL MODULES TO AN ELECTRICAL DEVICE

BACKGROUND

Field of the Invention

This invention relates to electrical interconnection systems for connecting a series of electrical modules to an electrical service panel or electrical devices.

Background of the Invention

Modular power systems typically consist of a series of modules connected together either in series or in parallel. They are normally connected by wires with male and female connectors on either side of the wiring that connects the modules. The wiring is either run along the backside of the modules along a mounting rack, or along the inside of the back frame of the module itself. In some cases, the wiring is run inside a wiring chase or raceway behind the modules.

Alternatively, the connecting wiring for multiple modules is integrated within the module itself, as described in patent application Ser. No. 15/261,160 submitted 9 Sep. 2016, entitled "Photovoltaic Modular System". When the wiring is integrated, or embedded within each of the modules in the system, there still is the need to connect the wiring from the modules to the electrical panel or devices being served by the modules.

For many modular electrical systems, a junction box or other similar equipment, connectors or parts are required for the connection to the power circuits that extend back to an electrical service panel. The connection to the interconnecting wiring with wire nuts or connectors, and installing junction boxes requires a lot of time and labor.

In summary, the key advantages posited for the electrical interconnection system include a system that:

provides an electrically insulated and environmentally protected pathway from the electrical modules to the electrical devices being served or to an electrical service panel;

provides a protected connection between the modules and the electrical conductors and wiring connecting the modules to electrical loads or panel;

allows multiple modules or rows of interconnected modules to be connected to this electrical interconnection system;

simplifies installation by providing a peel and stick adhesive system that allows the attachment of the system to a roof or other building structure; and further simplifies the installation by making the electrical connection of the modules to the electrical interconnection system by adhesively attaching the modules to the electrical interconnection system, eliminating the labor and materials needed for physically attaching each individual electrical connector.

SUMMARY

This invention has been developed in response to the present state of the art and, in particular, in response to the problems and needs in the art that have not yet been fully solved by currently available systems and methods. Features and advantages of different embodiments of the invention will become more fully apparent from the following description and appended claims, or may be learned by practice of the invention as set forth hereinafter.

Consistent with the foregoing, an electrical interconnection system is disclosed which simplifies the installation of electrical modules allowing the modules to be installed and connected together in the same step. The system further provides an electrical connecting system extending to either the devices being served by the modules or an electrical service panel.

The electrical interconnection system includes one or more linear lengths of partially insulated electrical conductors embedded within a membrane; a conductive surface of the partially insulated electrical conductors being exposed on an exterior surface of the membrane; and electrical wires connected to each of the one or more linear lengths of partially insulated electrical conductors, the conductors extending outside of the membrane to an electrical circuit.

In one embodiment, the conductive surface is adhesively attached and electrically connected to one or more electrical modules.

In another embodiment, the electrical modules further comprising electrical contacts that provide the electrically connected pathway from the one or more electrical modules to the conductive surface, the conductive surface is coated with electrical connection materials enabling electrical conduction from the electrical contacts to the conductive surface.

The electrical interconnection system further includes an electrically insulating adhesive coating a surface area between a first side of the membrane and the electrical modules, creating an air tight and moisture tight seal encapsulating the electrical connection area in another embodiment.

In an embodiment, the membrane further comprises an adhesive backing on a second side of the membrane opposite the first side of the membrane, which is covered by a protective backing material; wherein the protective backing material is removed at a time of installation, exposing the adhesive.

In another embodiment, the conductive surface on the exterior surface of the membrane is only exposed in areas that align to contacts of the one or more electrical modules to be electrically connected.

In an embodiment, the one or more electrical modules comprise solar photovoltaic roof shingles.

In another embodiment, the membrane is placed on a roof running from a top ridge of a roof and extending down to a bottom edge of a roof near the drip edge, soffit or rain gutter.

In one embodiment, the membrane is placed on a roof surface, interfacing with roof underlayment covering a surface area of a roof, the membrane thickness matching the thickness of the roof underlayment allowing the one or more electrical modules to be placed on top of the roof underlayment and membrane, the interfacing interlocking the membrane to the roof underlayment forming a seal.

In an embodiment, the electrical conductors and conductive surface is comprised of one or more of electrically conductive materials including alloys of copper, aluminum, nickel, stainless steel, silver, graphite, tungsten, and carbide.

In an embodiment, the electrical connection materials comprise electrically conductive adhesive.

In another embodiment, the electrically conductive adhesive comprises one or more electrically conductive materials of carbon, graphite, tungsten, graphene, gallium, rubidium, phosphorus, carbon nanotubes and carbide.

In an embodiment, the electrically insulating adhesive allows for expansion and contraction.

In one embodiment, the membrane is waterproof.

In another embodiment, the electrically insulating adhesive coating a surface area between a first side of the membrane and the electrical modules comprising: one part of a two-part epoxy system on the membrane; and a second part of the two-part epoxy system on the electrical modules.

In an embodiment, the electrically insulating adhesive area is covered by a protective backing material; wherein the protective backing material is removed at a time of installation, exposing the adhesive.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIG. 8A is an isometric view of a short electrical module 804 showing the electrical contacts that interface with adjacent modules, according to one example embodiment.

FIG. 8B is an isometric view of a short module stacked on top of and adhesively connected to a large module, according to one example embodiment.

DETAILED DESCRIPTION OF THE DRAWINGS

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
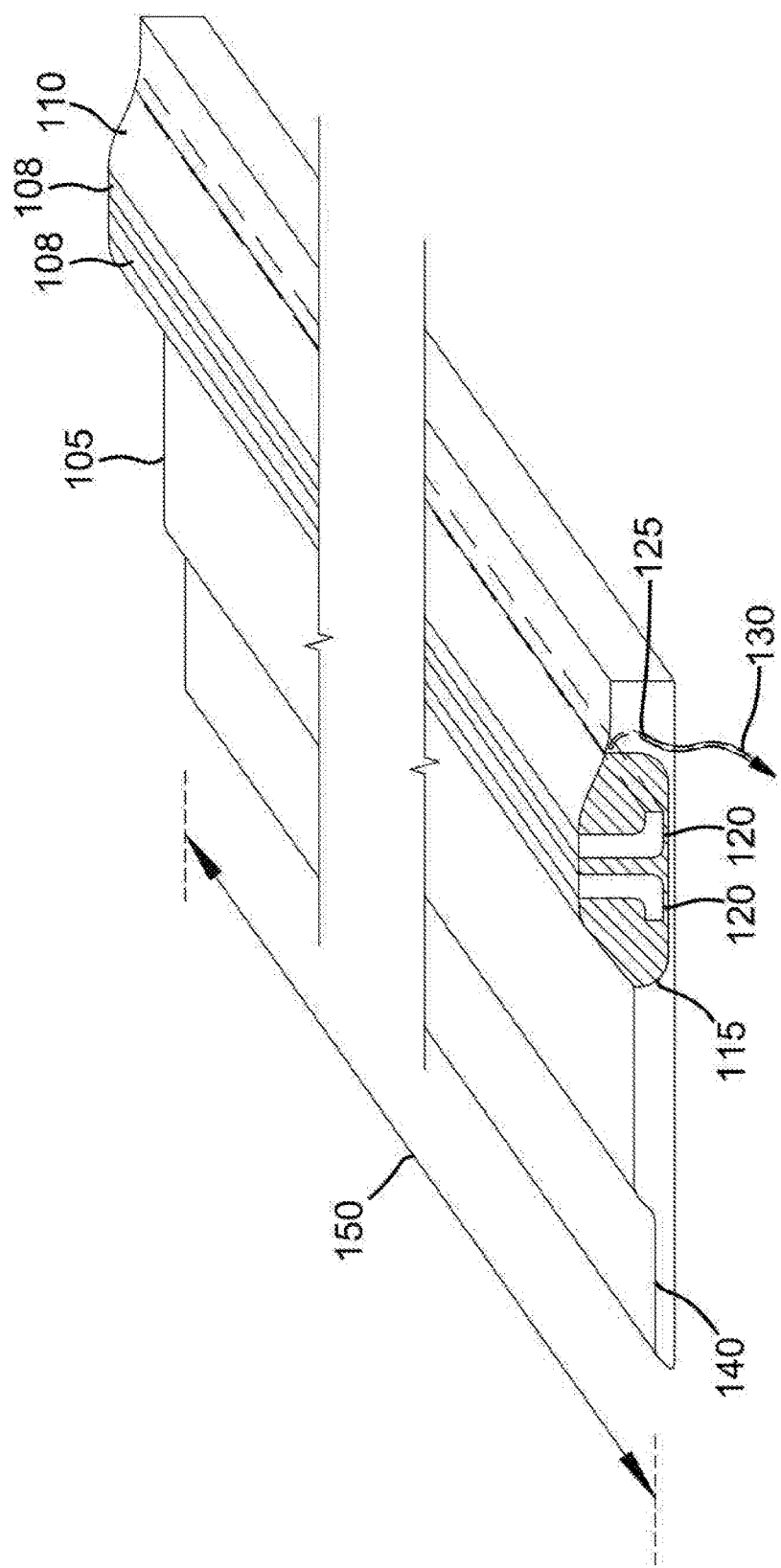
FIG. 1 is an isometric view of a membrane with electrical conductors surrounded by an electrically insulated material, according to one example embodiment.

FIG. 1 is an isometric view of a membrane 105 with electrical conductors 120, surrounded by an electrically insulated material 115. The conductors 120 and insulation 115 are embedded within the membrane 105. An exposed conductive surface 108 of the conductors 120 is shown on a top surface of the membrane 105. An interface area 110 comprising a raised area with exposed conductive surface 108 provides an interface for the connection of electrical modules to the membrane 105. Electrical wires 125 are electrically connected to the conductors 120 and extended 130 to an electrical service panel or to electrical devices or loads being served by the system. In one embodiment, the length 150 of the membrane 105 is determined by the size of the roof or building structure it is being installed onto. The membrane 105 can be cut to length as needed for the specific application. An interface area 140 is provided allowing the membrane to interlock with a roof underlayment.

Figure 2:
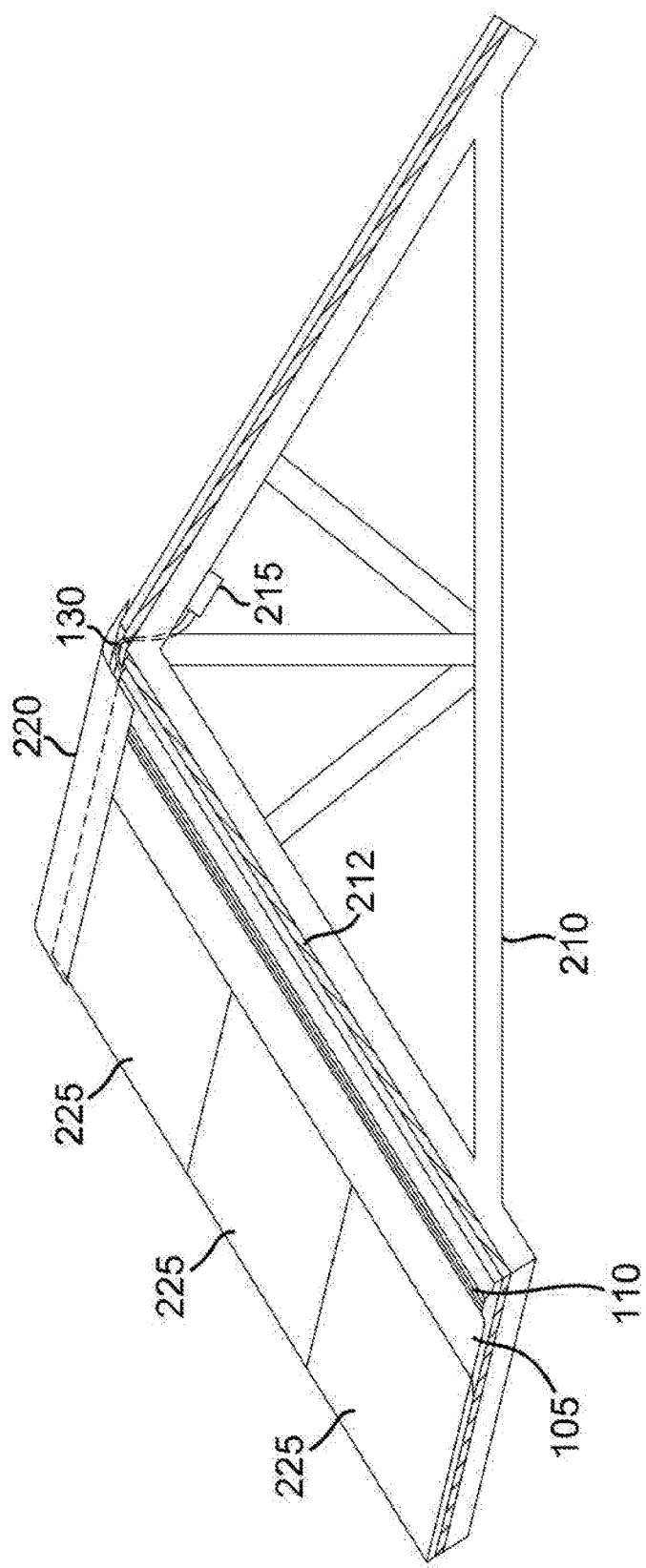
FIG. 2 is an isometric view of a roof showing the membrane and how it interfaces with several roof underlayment sections, according to one example embodiment.

FIG. 2 is an isometric view of a roof showing the membrane 105 and how it interfaces with several roof underlayment sections 225. A top ridge cap 220 is comprised of shingles or a roof venting assembly. The electrical wire 130 extension in this view is extended to a junction box 215 prior to being extended to the service panel or other devices. The membrane 105 is installed on the roof sheathing 212 or roofing surface as shown. The interface area 110 provides an interface for the connection of electrical modules. A truss system 210 supports the roof.

Figure 3:
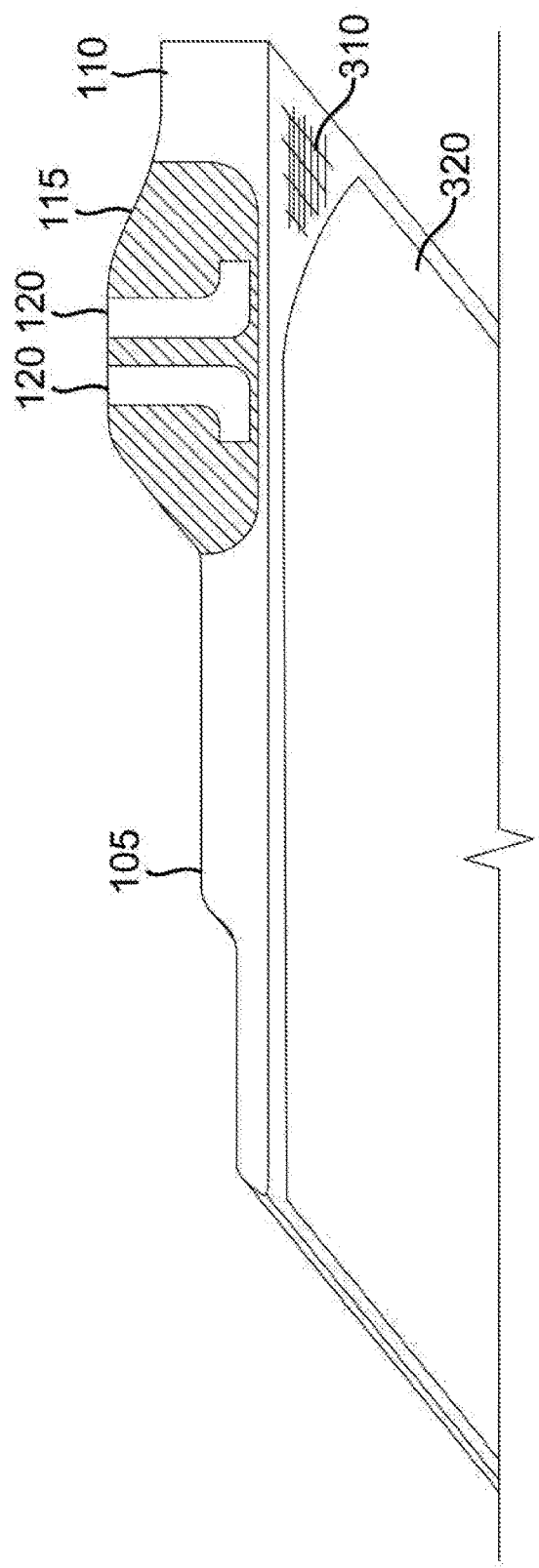
FIG. 3 is an isometric view showing a bottom view of the membrane which also shows adhesive and a protective backing material, according to one example embodiment.

FIG. 3 is an isometric view showing a bottom view of the membrane which also shows adhesive 310 and a protective backing material 320. When installing the membrane 105, the backing 320 is removed, exposing adhesive 310. The membrane can then be adhesively connected to the roof or other installation surface. Electrical conductors 120 are shown surrounded by insulation 115 within the interface area 110.

Figure 4:
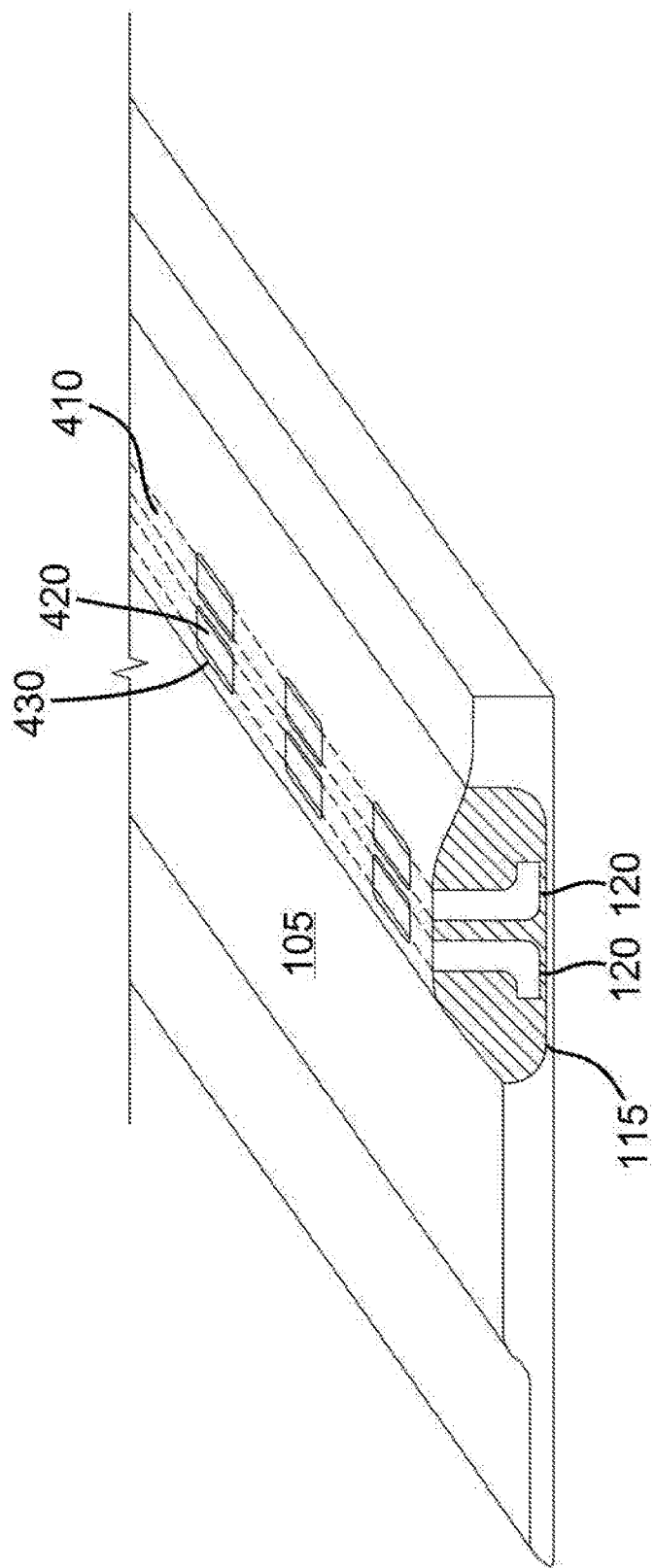
FIG. 4 is an isometric view of a top surface of the membrane showing an opening of areas exposing an area of the conductive surface, according to one example embodiment.

FIG. 4 is an isometric view of a top surface of the membrane 105 showing an opening 430 of areas exposing an area 420 of the conductive surface that aligns to modules that will be connected to the system. The space between the openings 430 are covered by electrically insulating material 410 providing further protection from water or other environmental intrusion. Electrical conductors 120 and insulation 115 is also shown.

Figure 5:
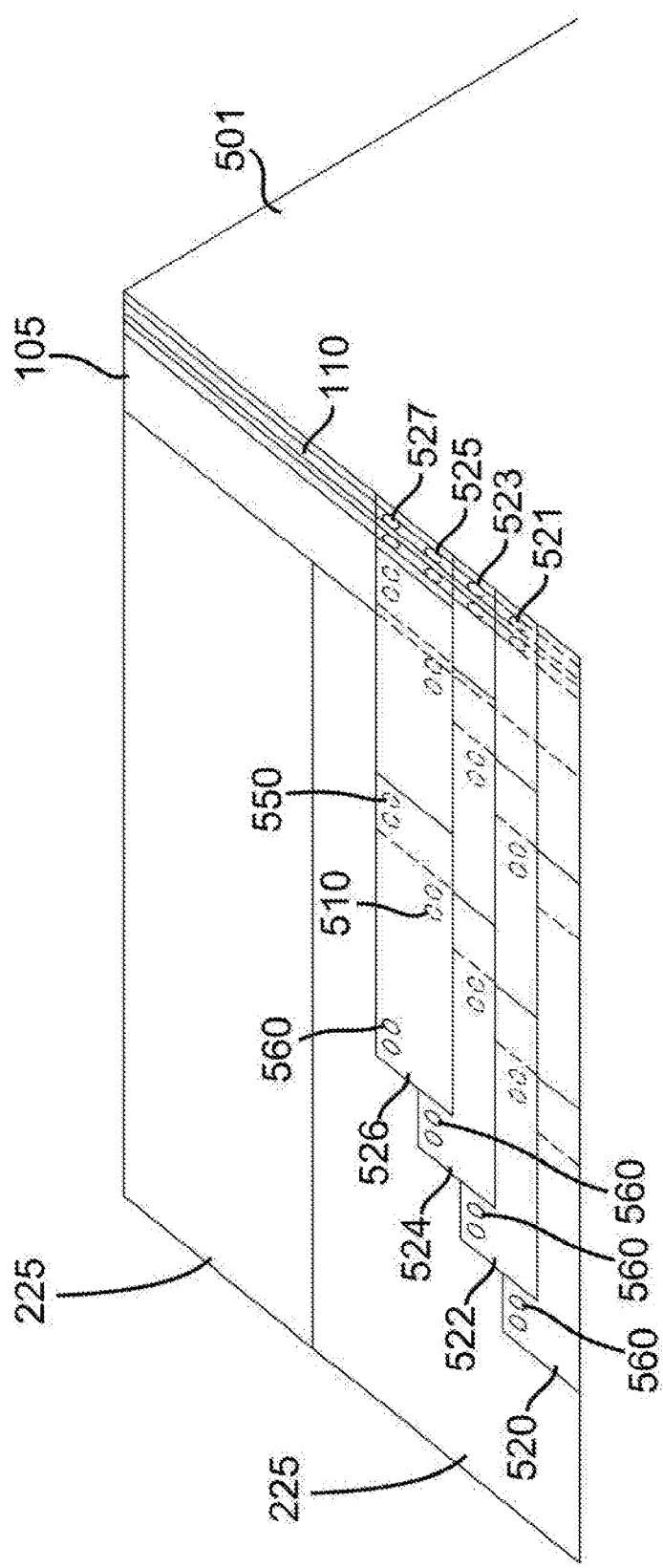
FIG. 5 is an isometric view of a roof showing the components of the electrical interconnection system, according to one example embodiment.

FIG. 5 is an isometric view of a roof showing the components of the electrical interconnection system. The membrane 105 is shown on one side of a roof 501 and extends from the top of the roof down to the bottom of the roof. The membrane 105 is cut to fit the length of the roof and is sealed 580 with an electrically insulating and waterproof sealant. Rows of electrical modules 520, 522, 524 and 526 are shown installed on top of roofing underlayment 225. Electrical contacts 560 are shown that connect modules to adjacent modules. Electrical contacts 510 and 550 are on a bottom side of the modules and are electrically and environmentally protected, both by the adhesive and also by the modules overlapping the contact area. Contacts 521, 523, 525 and 527 are shown connecting the module rows 520, 522, 524 and 526 to the membrane interface area 110.

Figure 6:
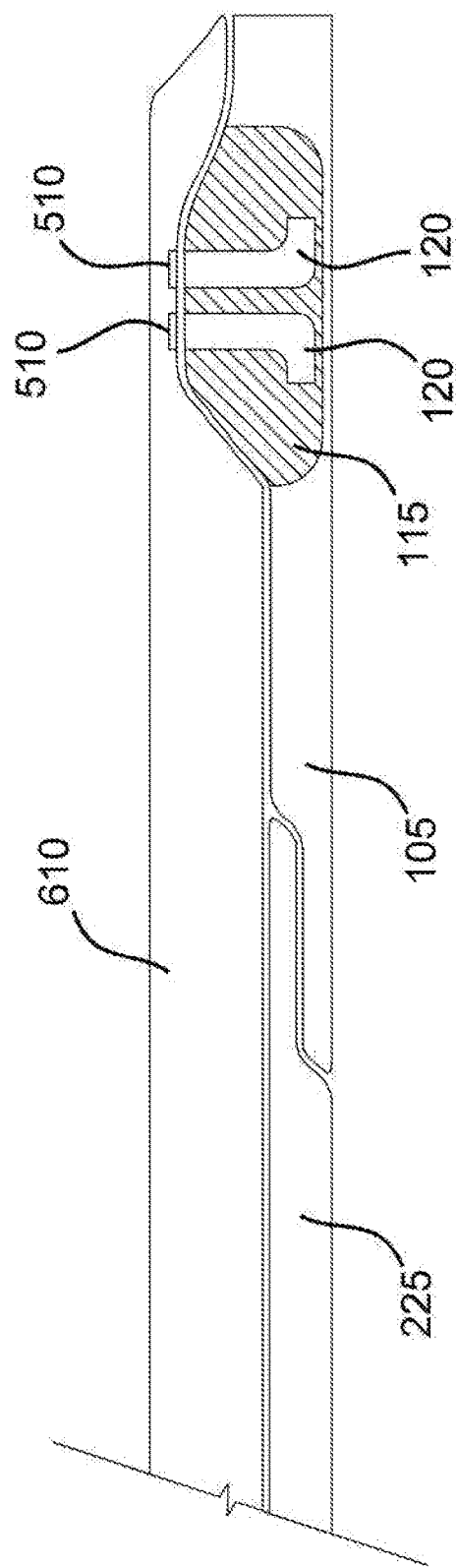
FIG. 6 is a section view of the electrical interconnection system showing the roof underlayment connecting to the membrane, according to one example embodiment.

FIG. 6 is a section view of the electrical interconnection system showing the roof underlayment 225 connecting to the membrane 105 forming a seal. Insulation 115 is shown protecting electrical conductors 120. The electrical conductors 120 connect to contacts 510 in the electrical module 610.

Figure 7:
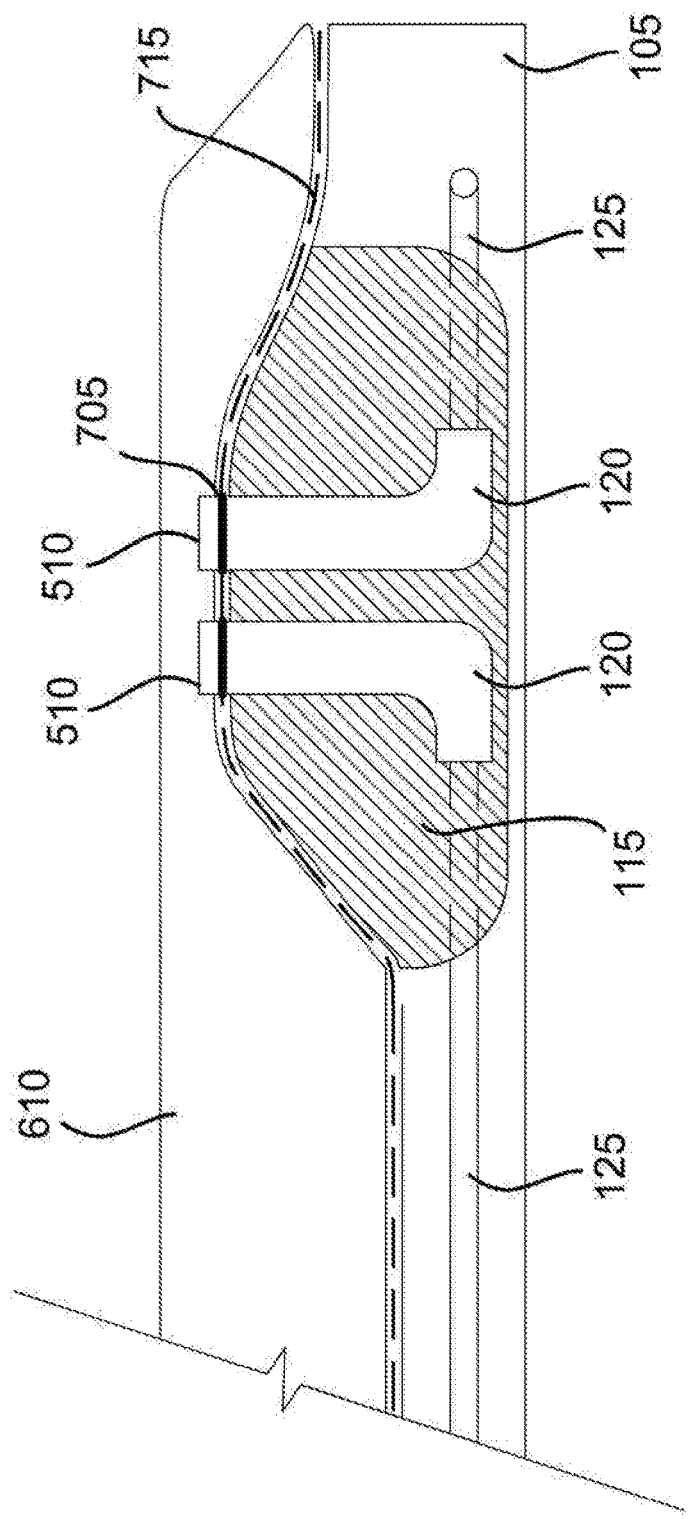
FIG. 7 is a large-scale section view of the interface between the membrane and electrical module, according to one example embodiment.

FIG. 7 is a large-scale section view of the interface between the membrane 105 and electrical module 610. Electrical wiring 125 is shown penetrating through the insulation 115, and connecting to the electrical conductors 120. Contacts 510 inside the electrical module 610 are electrically connected by an electrically conductive material 705 to a conductive surface of the electrical conductors 120 as shown. Electrically insulating adhesive 715 connects the module 610 to the membrane 105 and holds this connection in place providing an electrical pathway from the module to the electrical interconnection system.

FIG. 8A is an isometric view of a short electrical module 804 showing the electrical contacts 560 that interface with adjacent modules. The contacts 550 connect to the membrane.

FIG. 8B is an isometric view of a short module 806 stacked on top of and adhesively connected to a large module 808. Contacts 560 are shown which provide an electrical interface for adjacent modules. The modules are adhesively attached to the roof underlayment 225 and membrane 105. In this embodiment, electrical conductors 835 only extend to the point of connection to a lowest or end module. The conductors do not extend to the area 840 of the module 808. Module electrical contacts 550 are connected to the conductors 835 as shown.

Figure 9:
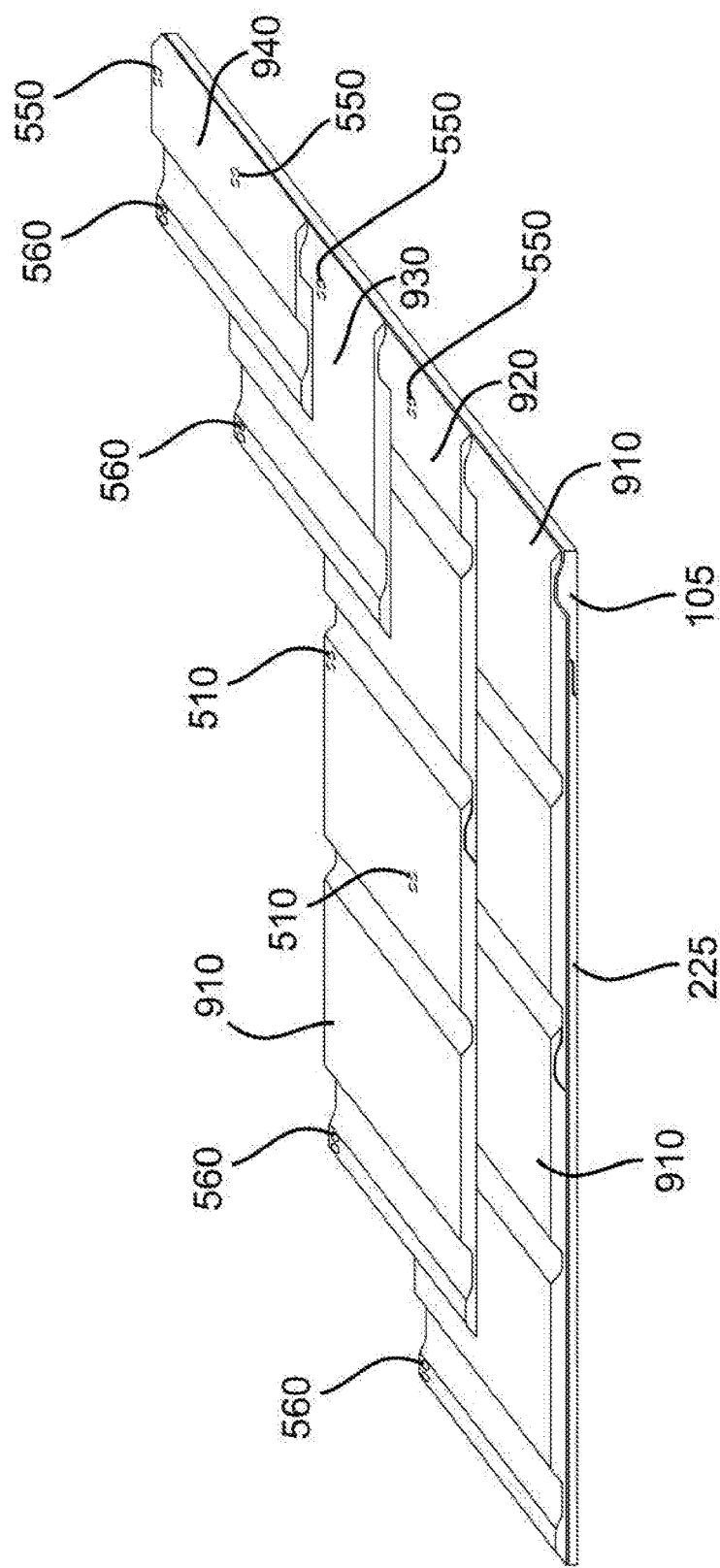
FIG. 9 is an isometric view showing a series of modules of various sizes connected to the electrical interconnection system, according to one example embodiment.

FIG. 9 is an isometric view showing a series of modules of various sizes connected to the electrical interconnection system. Small module 940 is stacked on top of medium module 930 which is on top of a larger module 920, which is then on top of a full-sized module 910. The connectors 550 of each of these modules are electrically connected to the membrane 105. Contacts 560 are shown which provide an electrical interface for adjacent modules. The modules are adhesively attached to the membrane 105 and roof underlayment 225 as shown. Contacts 510 are shown which connect modules to adjacent modules.

Figure 10:
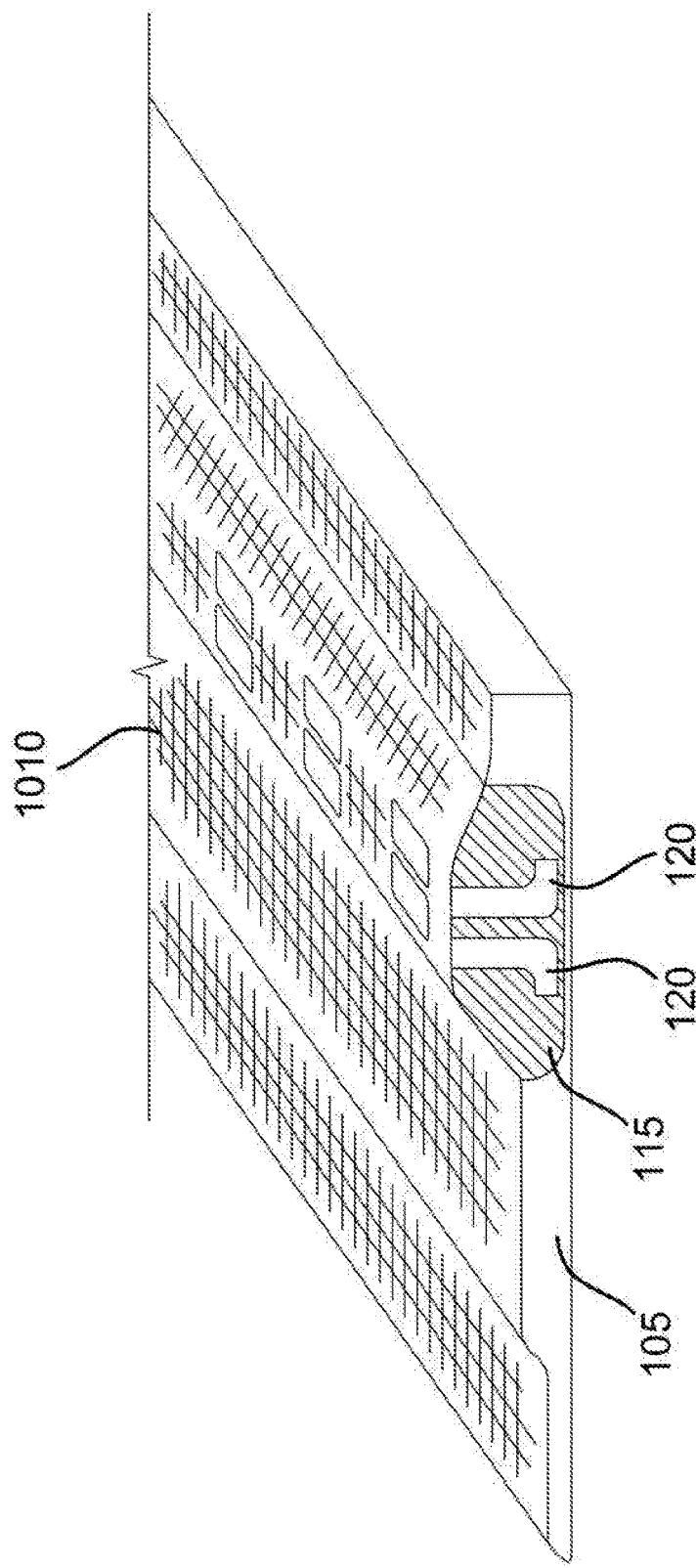
FIG. 10 is an isometric view of membrane showing a top surface of the membrane, according to one example embodiment.

FIG. 10 is an isometric view of membrane 105 showing a top surface of the membrane with an area 1010. Electrical conductors 120 are shown surrounded by insulation 115. Area 110 may comprise an adhesive, a primer or other composite that enhances the adhesion of the adhesive on the electrical modules that are adhesively attached to the membrane 105.

Figure 11:
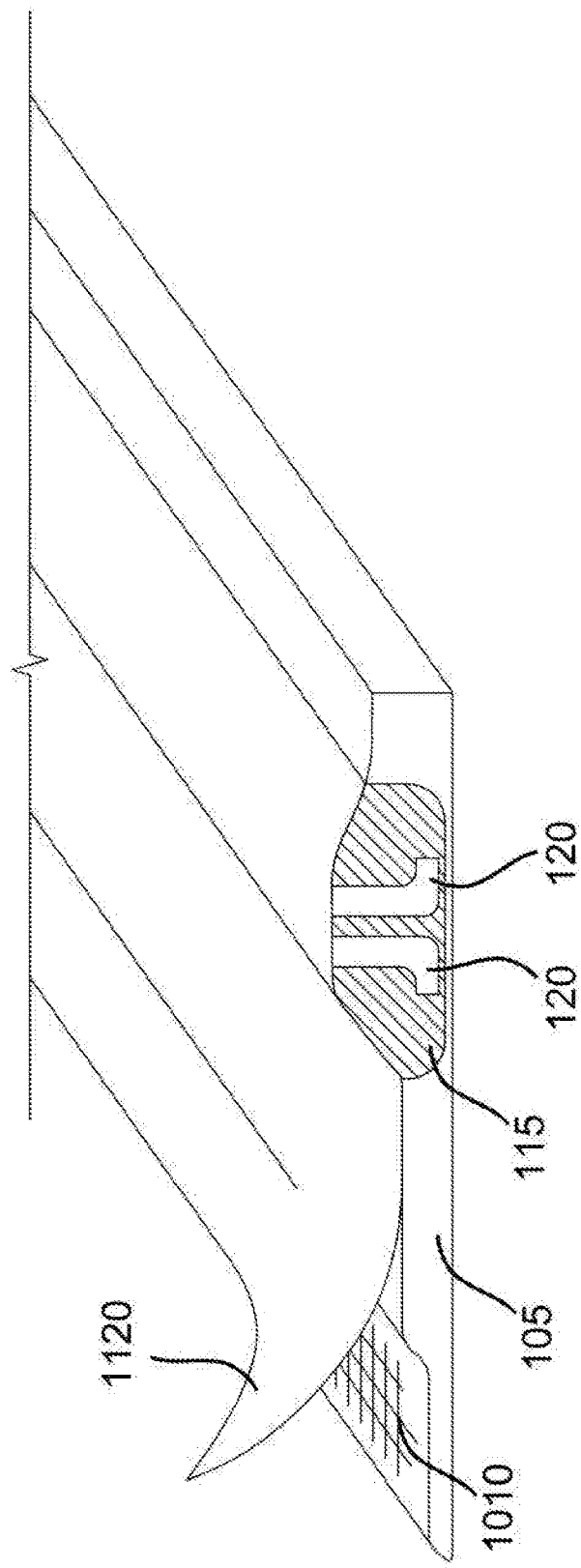
FIG. 11 is an isometric view of membrane 105 showing a top surface of the membrane and a protective backing material, according to one example embodiment.

FIG. 11 is an isometric view of membrane 105 showing a top surface of the membrane with an area 1010 and a protective backing material 1120. Electrical conductors 120 are shown surrounded by insulation 115. Area 110 may comprise an adhesive, a primer or other composite that enhances the adhesion of the adhesive on the electrical modules that are adhesively attached to the membrane 105. The protective backing material 1120 is removed prior to installation, exposing area 1010 allowing the modules to be adhesively attached to the membrane.

The invention claimed is:

1. An electrical interconnection system comprising:
one or more linear lengths of partially insulated electrical conductors;
a membrane having a raised area for interfacing with one or more electrical modules, wherein the partially insulated electrical conductors are embedded within the raised area of the membrane;
a conductive surface of the partially insulated electrical conductors being exposed on an exterior surface of the raised area of the membrane; and
electrical wires connected to each of the one or more linear lengths of partially insulated electrical conductors and extending outside of the membrane.

2. The electrical interconnection system of claim 1, wherein the conductive surface is adhesively attached and electrically connected to the one or more electrical modules.

3. The electrical interconnection system of claim 2, wherein the electrical modules further comprising electrical contacts that provide the electrically connected pathway from the one or more electrical modules to the conductive surface.

4. The electrical interconnection system of claim 2, wherein the conductive surface is coated with electrical connection materials enabling electrical conduction from the electrical contacts to the conductive surface.

5. The electrical interconnection system of claim 4, wherein an electrically insulating adhesive coats a surface area between a first side of the membrane and the electrical modules, creating an air tight and moisture tight seal encapsulating the electrical connection area.

6. The electrical interconnection system of claim 1, wherein the membrane further comprises an adhesive backing on a second side of the membrane opposite the first side of the membrane, which is covered by a protective backing material; and
wherein the protective backing material is removed at a time of installation, exposing the adhesive.

7. The electrical interconnection system of claim 2, wherein the conductive surface on the exterior surface of the membrane is only exposed in areas that align to contacts of the one or more electrical modules to be electrically connected.

8. The electrical interconnection system of claim 2, wherein the one or more electrical modules comprise solar photovoltaic roof shingles.

9. The electrical interconnection system of claim 1, wherein the membrane is placed on a roof running from a top ridge and extending down to a bottom edge near the soffit, rain gutter or drip edge.

10. The electrical interconnection system of claim 3, wherein the membrane is placed on a roof surface, interfacing with roof underlayment covering a surface area of a roof, the membrane thickness matching the thickness of the roof underlayment allowing the one or more electrical modules to be placed on top of the roof underlayment and membrane.

11. The electrical interconnection system of claim 1, wherein the membrane further includes an interface area that interlocks with the roof underlayment, forming a seal.

12. The electrical interconnection system of claim 1, wherein the electrical conductors and conductive surface is comprised of one or more of electrically conductive materials including alloys of copper, aluminum, nickel, stainless steel, silver, graphite, tungsten, and carbide.

13. The electrical interconnection system of claim 4, wherein the electrical connection materials comprise an electrically conductive adhesive.

14. The electrical interconnection system of claim 13, wherein the electrically conductive adhesive comprises one or more electrically conductive materials of carbon, graphite, tungsten, graphene, gallium, rubidium, phosphorus, carbon nanotubes and carbide.

15. The electrical interconnection system of claim 5, wherein the electrically insulating adhesive allows for expansion and contraction.

16. The electrical interconnection system of claim 1, wherein the membrane is waterproof.

17. The electrical interconnection system of claim 1, wherein a top surface area of the membrane is covered with an adhesive or primer that enhances the adhesion of the adhesive connection between the electrical modules and the membrane.

18. The electrical interconnection system of claim 5, wherein the electrically insulating adhesive coating a surface area between a first side of the membrane and the electrical modules comprising: one part of a two-part epoxy system on the membrane; and
 a second part of the two-part epoxy system on the electrical modules.

19. The electrical interconnection system of claim 1, wherein the membrane can be cut to length as needed to fit the requirements of the specific application, the cut end being sealed by a weather proof and electrically insulating material.

20. The electrical interconnection system of claim 5, wherein the electrically insulating adhesive area is covered by a protective backing material; wherein the protective backing material is removed at a time of installation, exposing the adhesive.

\* \* \* \* \*